US008859999B2

(12) United States Patent
Kim et al.

(10) Patent No.: US 8,859,999 B2
(45) Date of Patent: Oct. 14, 2014

(54) MOVEMENT-FREE BENDING METHOD FOR ONE-DIMENSIONAL OR TWO-DIMENSIONAL NANOSTRUCTURE USING ION BEAM

(71) Applicant: Korea Research Institute of Standards and Science, Daejeon (KR)

(72) Inventors: Dal Hyoun Kim, Daejeon (KR); Hwack Joo Lee, Daejeon (KR); Sang Jung Ahn, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 14/125,392

(22) PCT Filed: Dec. 6, 2012

(86) PCT No.: PCT/KR2012/010528
§ 371 (c)(1),
(2), (4) Date: Dec. 11, 2013

(87) PCT Pub. No.: WO2013/100424
PCT Pub. Date: Jul. 4, 2013

(65) Prior Publication Data
US 2014/0110608 A1      Apr. 24, 2014

(30) Foreign Application Priority Data

Dec. 26, 2011   (KR) ........................ 10-2011-0142613

(51) Int. Cl.
*A61N 5/00*   (2006.01)
*G21G 5/00*   (2006.01)
*B82B 3/00*   (2006.01)
*H01J 37/317* (2006.01)

(52) U.S. Cl.
CPC ............. *H01J 37/317* (2013.01); *B82B 3/0023* (2013.01); *B82B 3/0076* (2013.01); *Y10S 977/901* (2013.01); *Y10S 977/84* (2013.01); *Y10S 977/842* (2013.01)
USPC ..................... 250/492.3; 250/491.1; 977/901; 977/840; 977/842

(58) Field of Classification Search
USPC ............. 250/492.3, 491.1; 977/901, 840, 842
See application file for complete search history.

(56) References Cited

U.S. PATENT DOCUMENTS 7,628,972 B2 * 12/2009 Stevens ..................... 423/445 R

FOREIGN PATENT DOCUMENTS

JP              6-114481 A       4/1994

(Continued)

OTHER PUBLICATIONS

Korean Patent and Trademark Office, Notice of Allowance issued in Korean Patent Application No. 10-2011-0142613 dated Dec. 23, 2013.

(Continued)

*Primary Examiner* — Jack Berman
*Assistant Examiner* — Meenakshi Sahu
(74) *Attorney, Agent, or Firm* — Sughrue Mion, PLLC

(57) ABSTRACT

The movement-free bending method means the one of deformation methods for a one- or two-dimensional nanostructures using an ion beam capable of bending and deforming them and furthermore, changing a bending direction without requiring a motion such as a rotation of the nanostructures. The present invention affords a movement-free bending method for deforming the nanostructure 20 having the one-dimensional or two-dimensional shape by irradiating the ion beam 10, wherein a bending direction of the nanostructure 20 is controlled depending on energy of the ion beam 10 or a thickness of the nanostructure 20.

17 Claims, 9 Drawing Sheets

(56) References Cited

FOREIGN PATENT DOCUMENTS

| | | |
|---|---|---|
| JP | 2002-162332 A | 6/2002 |
| KR | 10-0215218 B1 | 8/1999 |
| KR | 10-2006-0045876 A | 5/2006 |
| KR | 10-2007-0052844 A | 5/2007 |
| KR | 10-0767994 B1 | 10/2007 |

OTHER PUBLICATIONS

Borschel et al. "Permanent bending and alignment of ZnO nanowires" IOP Publishing: Nanotechnology, Mar. 2011, pp. 1-9, vol. 22.

International Searching Authority, International Search Report for PCT/KR2012/010528 dated Mar. 11, 2013.

* cited by examiner

FIG. 9
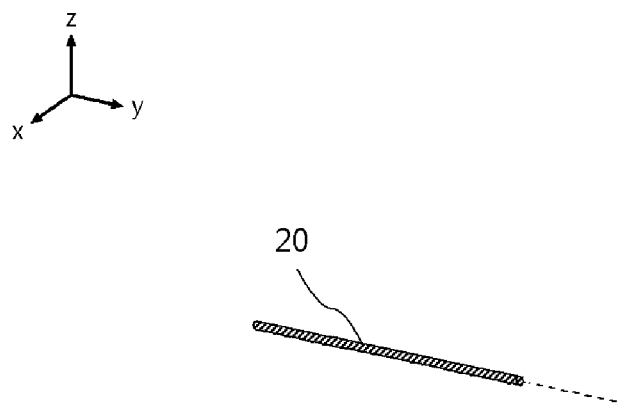
(A)
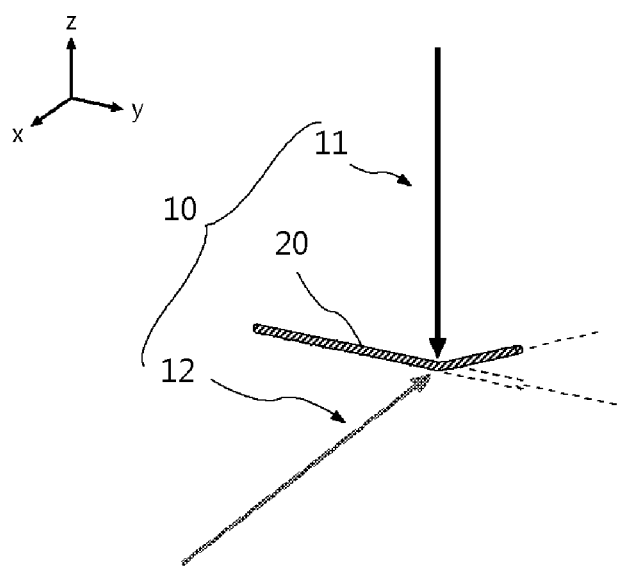
(B)

MOVEMENT-FREE BENDING METHOD FOR ONE-DIMENSIONAL OR TWO-DIMENSIONAL NANOSTRUCTURE USING ION BEAM

CROSS REFERENCE TO RELATED APPLICATIONS

This application is a National Stage of International Application No. PCT/KR2012/010528 filed Dec. 6, 2012, claiming priority based on Korean Patent Application No. 10-2011-0142613 filed Dec. 26, 2011, the contents of all of which are incorporated herein by reference in their entirety.

TECHNICAL FIELD

The present invention describes a movement-free bending method for a one-dimensional or two-dimensional nanostructure using an ion beam.

A nanotechnology collectively refers to a technology creating an ultrafine device or a new material by manipulating atoms or molecules in a world of nanometer-unit ($10^{-9}$ m). Recently, the nanotechnology has been widely applied to a field such as devices and a new material manufacturing. Since a demand and an interest in a nanorobot and the likes have gradually increased, more extensive researches on the deformation of an object based on the nanometer-unit have been actively conducted.

In general, the deformation of the object is caused by applying mechanical forces on it, however, in the world of the nanometer-unit, due to the difficulties to implement an operation of applying the mechanical force to the objects or an operation of fixing and of supporting them during the application of the force, an approach in a different viewpoint away from a general object deformation method has been conducted. Among these, for example, one approach is a deformation method using an ion beam. The Korean Patent No. 0215218 ("Manufacturing method of field emitter metal tip using ion beam transformation method," issued on May 21, 1999, hereinafter, referring to the related art 1) discloses a technique in which an upper portion of a metal emitter is deformed into a shape of the tip by striking ion beam against the metal emitter. The deformation described in the related art 1 is a deformation of an area unit on the surface of the object, and the method of the related art 1 does not require complex processes such as deposition, etching, and the like and also it enables a desired form of the metal tip.

BACKGROUND ART

Some of researches using an ion beam for bending and deforming a one- or two-dimensional nanostructure in a viewpoint thoroughly different from the deformation in the related art 1 described above, that is, the deformation of an area unit have also been conducted. The Korean Patent No. 0767994 ("Deformation method of nanometer scale material using a particle beam and nano tool thereby," issued on Oct. 11, 2007, hereinafter, referring to the related art 2) discloses a technique for allowing a nano scale material to be bent toward the direction of particle beam source through irradiating particle beam on the nano scale material. Particularly, this method in the related art 2 may be efficiently used for bending and deforming a nanostructure of the bar or with protrusions.

However, in the case of the related art 2, because a bending direction of the nanostructure has the same direction as a particle beam direction, a repetition of operations such as irradiation of particle beam, rotation of the nanostructure, so forth is required to change the bending direction of the nanostructure. In this case, in order to rotate the nanostructure having a micro-size in vacuum, a very precise control is required, such that it takes a long time. In addition, even though it is performed, it is very difficult to precisely return to a previous position, such that it is difficult to precisely generate the bending deformation in a desired direction.

Therefore, in a case of performing the bending deformation for the nanostructure using the ion beam, a new technique capable of changing a bending direction without movements such as the rotation of the nanostructure, is increasingly demanded.

RELATED ART DOCUMENT

Patent Document

1. Korean Patent No. 0215218 ("Manufacturing method of field emitter metal tip using ion beam transformation method," issued on May 21, 1999)
2. Korean Patent No. 0767994 ("Deformation method of nanometer scale material using particle beam and nano tool thereby," issued on Oct. 11, 2007)

DISCLOSURE

Technical Problem

The aim of the present invention is to provide a movement-free bending method for a one-dimensional or two-dimensional nanostructure using an ion beam capable of bending and changing a bending direction without requiring a motion such as a rotation of the nanostructure.

Technical Solution

In one general aspect, the present invention provides a movement-free bending method for a one-dimensional or two-dimensional nanostructure 20 using an ion beam 10, wherein a bending direction of the nanostructure 20 is controlled depending on energy of the ion beam 10.

The bending direction and a shape of the nanostructure 20 may be adjusted by repeatedly and alternately irradiating high energy ion beam 11 having energy bending the nanostructure 20 toward the direction of ion beam source S and low energy ion beam 12 having energy bending the nanostructure 20 to ion beam going direction P.

In another general aspect, the invention provides a movement-free bending method for a one-dimensional or two-dimensional nanostructure 20 using an ion beam 10, wherein a bending direction of the nanostructure 20 is controlled depending on a thickness of the nanostructure 20.

The nanostructure 20 may be formed in a shape comprising a narrow width portion N having a thickness bent toward the direction of ion beam source S and a wide width portion W having a thickness bent to ion beam going direction at the time of irradiating the ion beam 10, such that the ion beam 10 may be irradiated on the nanostructure 20 comprising the narrow width portion N and the wide width portion W to thereby form a shape in which the bending direction is changed for an extended direction of the nanostructure 20.

The nanostructure 20 may be formed in a shape in which the thickness thereof is gradually changed.

The nanostructure 20 may be at least one selected from a nano tube, a nano wire, a cantilever, and a thin film.

A hole 35 may be formed between the ion beam 10 and the nanostructure 20, and an ion beam blocker 30 blocking a progress of the ion beam 10 at portions other than the hole 35 may be provided, such that the ion beam 10 may be irradiated on only a portion of the nanostructure 20 by the ion beam blocker 30.

The ion beam blocker 30 may have at least one hole 35 formed therein.

The ion beam blocker 30 may have a variable position.

The ion beam 10 may have a variable irradiation position.

The nanostructure 20 may have a one-dimensional shape and a pair of ion beams 10 may be irradiated on the nanostructure 20, and the pair of ion beams 10 may be formed so as to be each perpendicular to an extended direction of the nanostructure 20 and be orthogonal to each other.

Advantageous Effects

According to the present invention, the nanostructure may be bent and deformed toward the target direction without having the motion such as a rotation of a nanostructure or the changing of a position of the nanostructure by repeatedly using high energy ion beam bending the nanostructure toward the direction of ion beam source and low energy ion beam bending the nanostructure to ion beam going direction for one-dimensional or two-dimensional nanostructures such as a nano tube, a nano wire, a cantilever, a thin film, and the like. As described above, since a precise control work such as a readjustment of an irradiation position of the ion beam during a motion of the nanostructure or after the motion of the nanostructure may be essentially omitted by implementing movement-free (motionless) during a process of forming the nanostructure, resources such as time, workers, cost, and the like necessary to perform the above-mentioned work may be significantly saved.

In addition, according to the present invention, the formation may be made without worrying about damage to a specific portion such as an end portion of the nanostructure. Further, according to the present invention, since the time taken in the formation work such as bending is significantly saved as described above, the nanostructure having a desired form may be very rapidly mass-produced.

DESCRIPTION OF DRAWINGS

The above and other objects, features and advantages of the present invention will become apparent from the following description of preferred embodiments given in conjunction with the accompanying drawings, in which:

FIG. 9 shows an embodiment of a bending shape change on a three-dimensional space using a pair of ion beams orthogonal to each other.

[Detailed Description of Main Elements]

Figure 1:
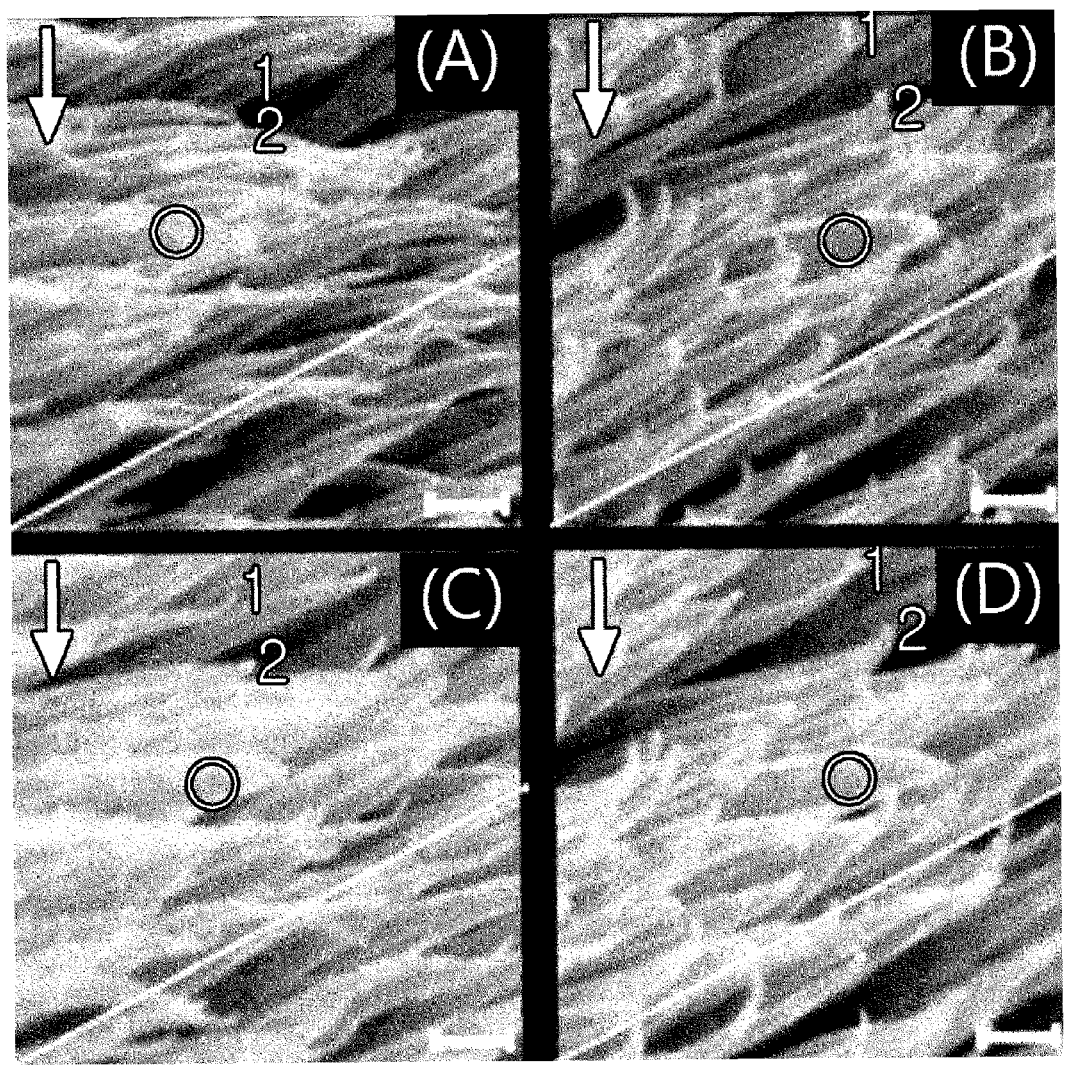
FIG. 1 shows an experimental results in which a nanostructure is bent by ion beam irradiation.

| | |
|---|---|
| 10: ion beam | 20: nanostructure |
| 11: high energy ion beam | 12: low energy ion beam |

[Detailed Description of Main Elements]

| | |
|---|---|
| 30: ion beam blocker | 35: hole |
| 40: target object | |

BEST MODE

Hereinafter, a movement-free bending method for a one-dimensional or two-dimensional nanostructure using an ion beam according to the embodiments of the present invention having the above-mentioned configuration will be described in detail with reference to the accompanying drawings.

First, a phenomenon in which the nanostructure is bent by an ion beam irradiation will be described with reference to FIG. 1.

From a recent research, it was found that when the ion beam is irradiated on the nanostructure, a direction in which the nanostructure is bent is changed depending on ion beam energy and a thickness of the nanostructure. That is, a phenomenon was observed in which when the ion beam having energy greater than any certain ion beam energy value is incident on a nano needle, the nano needle is bent toward the direction of ion beam source, and when the ion beam having energy smaller than the certain ion beam energy value is incident on the nano needle, the nano needle is bent to ion beam going direction. FIG. 1 shows a series of photographs showing the experimental results that the present applicants did an experiment on the same region of a ZnO nano needle while changing an acceleration voltage of the ion beam. In FIG. 1, the portions indicated by a circle in each photograph represent the same nano needle of a sample. By these portions, the shape changes of an individual nano needle can be tracked during the experiment progress. The nano needles indicated by 1 and 2 in FIG. 1 typically indicate the nano needles showing an aspect that they were bent to the ion beam going direction (an arrow direction in FIG. 1) in FIGS. 1A and 1C in which low energy ion beam is irradiated and bent toward the direction of ion beam source (a direction opposite to the arrow in FIG. 1) in FIGS. 1B and 1D in which high energy ion beam is irradiated.

First, referring to FIG. 1A, it may be appreciated that when the low energy ion beam generated by the acceleration voltage having a predetermined reference or less is incident on the nano needle parallel with a substrate surface, a stem portion (i.e., a thick portion) of the nano needle is bent in a downward direction which is the ion beam going direction, and an end portion (i.e., a thin portion) of the nano needle is bent to upward direction which is the direction of ion beam source.

Next, referring to FIG. 1B, it may be appreciated that when the high energy ion beam generated by the acceleration voltage having a predetermined reference or more is incident on the nano needle bent in the downward direction as in FIG. 1A, the stem portion of the nano needle (which was bent in the downward direction which is the ion beam going direction in FIG. 1A) is also bent toward the direction of ion beam source, that is, an opposite direction. That is, hereby, it is firstly found that even the nanostructure bent in the ion beam going direction by the low energy ion beam may be again bent to original direction, that is, the opposite direction which is the ion beam source direction by irradiating the high energy ion beam thereto.

When the low energy ion beam is again irradiated on the nano needle, it is observed that the stem portion is again bent in the ion beam going direction and the end portion is again bent toward the direction of ion beam source, as shown in FIG. 1C. When the high energy ion beam is yet again irradiated on the nano needle, the stem portion is again bent toward the direction of ion beam source as shown in FIG. 1D. That is, it may be again appreciated that the nanostructure may be bent in a direction opposite to a specific direction by irradiating the low energy ion beam on the nanostructure bent in the specific direction using the high energy ion beam and vice versa (the low energy ion beam irradiation and the high energy ion beam irradiation).

From the experiment result, it may be appreciated that the bent direction of the nanostructure when irradiating the ion beam on the nanostructure may be changed depending on the energy difference (from the difference in the experiment result of the high energy ion beam and the low energy ion beam) or the thickness difference of the nanostructure (from the experiment result difference of the stem portion and the end portion of the nano needle).

In the technologies such as the related art 2, and the like described above, there were difficulties that the nanostructure needs to be precisely moved in the case of attempting to change the bent direction of the nanostructure, and the like since only the phenomenon in which the nanostructure is bent toward the direction of particle beam source at the time of irradiating the particle beam such as the ion beam is used. In this case, based on the idea from the experiment result that the bent direction may be adjusted depending on energy of the incident ion beam or the thickness of the nanostructure without moving the nanostructure, the present invention suggests a method of generating a bending transformation in a desired direction while the nanostructure is absolutely not moved (motionless).

The movement-free bending method for the one-dimensional or two-dimensional nanostructure using the ion beam, which is a bending method bending a nanostructure 20 having a one-dimensional or two-dimensional shape by irradiating ion beam 10, may control the bending direction of the nanostructure 20 depending on energy of the ion beam 10. More specifically, the bending direction and the shape of the nanostructure 20 are adjusted by repeatedly and alternately irradiating high energy ion beam 11 having energy bending the nanostructure 20 toward the direction of ion beam source S and low energy ion beam 12 having energy bending the nanostructure 20 to ion beam going direction P.

Figure 2:
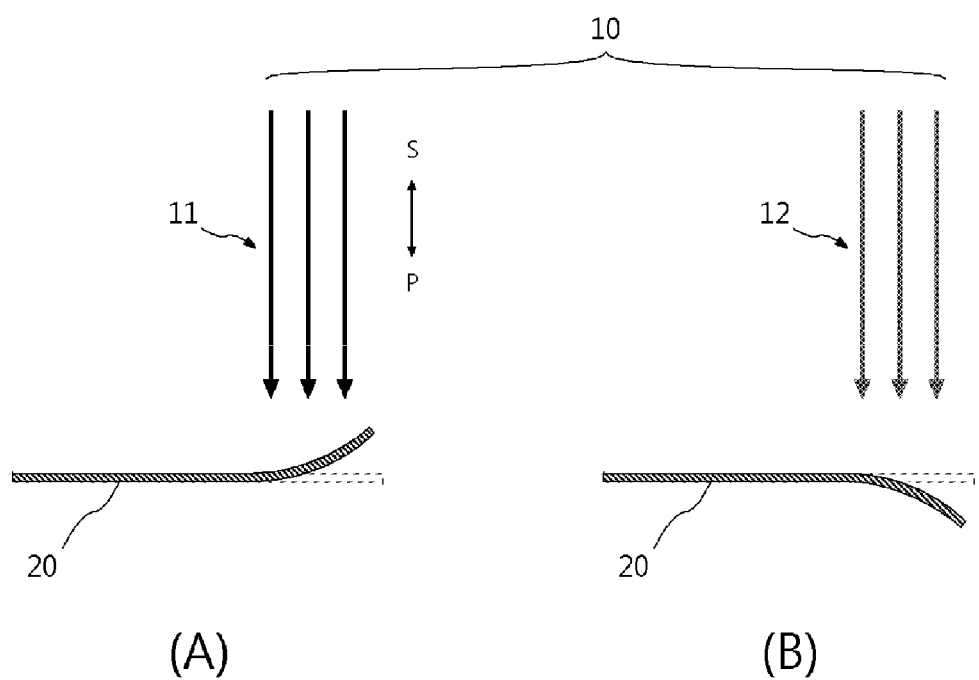
FIG. 2 shows a bending difference depending on an energy difference of ion beam.

FIG. 2 is a concept view showing that the bending direction is changed depending on an energy difference of the ion beam. As shown in FIG. 2, when the ion beam 10 is irradiated on the nanostructure 20 and the high energy ion beam 11 having (relatively) high energy generated by an acceleration voltage higher than a predetermined reference is irradiated, the nanostructure 20 is bent toward the direction of ion beam source (i.e., an ion beam source direction, indicated by S) as shown in FIG. 2A, and when the low energy ion beam 12 having (relatively) low energy generated by an acceleration voltage lower than the predetermined reference is irradiated, the nanostructure 20 is bent in the ion beam going direction (indicated by P) as shown in FIG. 2B.

Here, since the reference dividing the high energy and the low energy is changed depending on ion kinds of ion beam, a material of the nanostructure, a shape such as a thickness or the like of the nanostructure (to be described below), and the like, it is not determined by any one value. When any ion beam is irradiated on any nanostructure, if the nanostructure is bent toward the direction of ion beam source, then the ion beam in this case is 'the high energy ion beam', and if the nanostructure is bent in the ion beam going direction, the ion beam in this case is 'the low energy ion beam'. That is, the expressions such as the high energy and low energy may be a relative concept (high or low relative to each other) and may be a result expression determined depending on the bent direction of the nanostructure (once the corresponding ion beam is irradiated).

As a specific example, the ion beam used in the experiment of FIG. 1 is Ga ion beam, the thickness of the ZnO nano needle is approximately 10 nm, and a result was obtained that when energy of the ion beam is 5 to 15 keV, the nano needle is bent in the ion beam going direction, and when energy is 30 keV, the nano needle is bent toward the direction of ion beam source. That is, in the experiment of FIG. 1, 'high energy ion beam' is the ion beam having 30 keV energy and 'low energy ion beam' is the ion beam having 5 to 15 keV energy. Of course, this is merely one example, and when the material, the thickness, or the like of the nano needle is changed or the kind of ion beam is changed, the energy value corresponding to 'the high energy ion beam' and 'the low energy ion beam' may be variously changed. That is, the experiment condition of FIG. 1 is merely one example, and the present invention is not limited thereto.

The movement-free bending method for the one-dimensional or two-dimensional nanostructure using the ion beam, which is a bending method bending a nanostructure 20 having a one-dimensional or two-dimensional shape by irradiating the ion beam 10, may control the bending direction of the nanostructure 20 depending on the thickness of the nanostructure 20. More specifically, the nanostructure 20 is formed in a shape including a narrow width portion N of a thickness bent toward the direction of ion beam source S and a wide width portion W of a thickness bent in the ion beam going direction when irradiating the ion beam 10, where the shape is formed in which a bending direction is changed for an extended direction of the nanostructure 20 by irradiating the ion beam 10 on the nanostructure 20 having the narrow width portion N and the wide width portion W.

Figure 3:
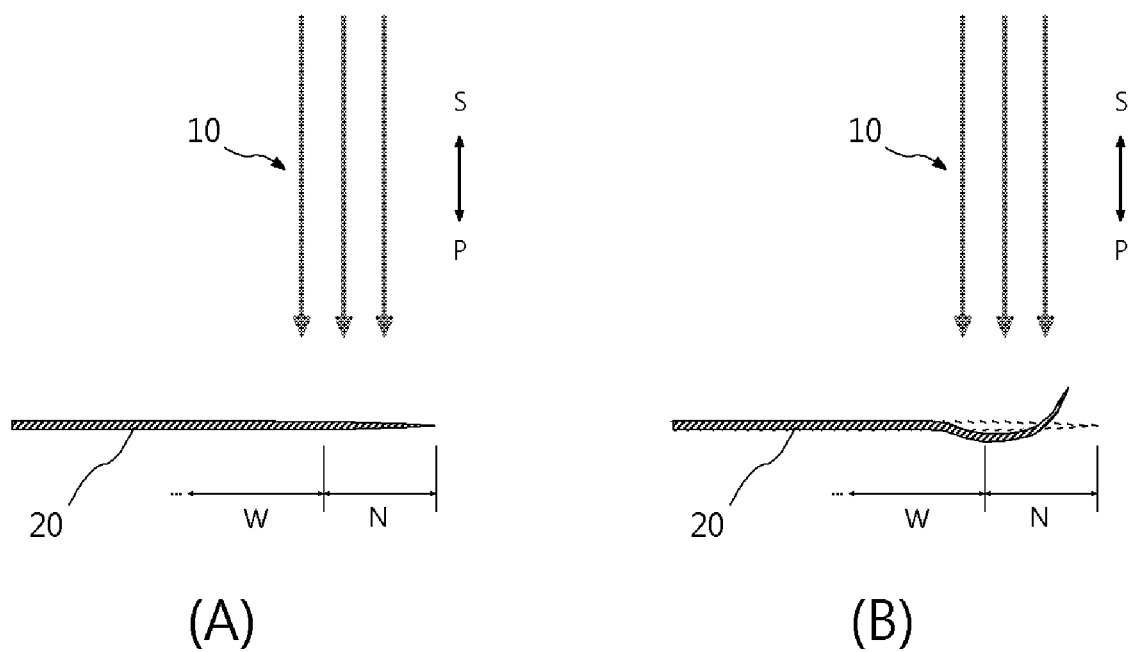
FIG. 3 shows a bending difference depending on a thickness difference of the nanostructure.

FIG. 3 is a concept view showing that the bending direction is changed depending on the thickness of the nanostructure. As shown in FIG. 3, once the ion beam 10 is irradiated on any nanostructure 20 having the narrow width portion N and the wide width portion W, the bent direction is changed depending on the thickness of the nanostructure 20 no matter whether the same ion beam is irradiated. Referring to FIG. 3, when any ion beam 10 is irradiated on the nanostructure 20 having the changing thickness, a portion having a thin thickness of the nanostructure 20, that is, the narrow width portion N is bent toward the direction of ion beam source S by the ion beam 10 and a portion having a thick thickness of the nanostructure 20, that is, the wide width portion W is bent in the ion beam going direction P by the same ion beam 10. That is, even if the ion beam 10 is equal, the ion beam 10 may act as the high energy ion beam bending the nanostructure in the ion beam source direction S depending on the thickness of the nanostructure 20 and may conversely act as the low energy ion beam bending the nanostructure in the ion beam going direction S.

Similar to the reference dividing the high energy and the low energy described above, since a reference dividing a narrow width and a wide width is also changed depending on ion kinds of the ion beam, a material of the nanostructure, energy of the ion beam, or the like, it is not determined by any one value. When any ion beam is irradiated on any nanostructure, if the nanostructure is bent toward the direction of ion beam source, then the thickness of the nanostructure is 'the narrow width', and if the nanostructure is bent to the ion beam going direction, the thickness of the nanostructure is 'the wide width'. That is, the expressions such as the narrow width and wide width may be a relative concept (large or small relatively to each other) similar to the expressions such as the high energy and low energy, and may be a result expressions determined depending on the bent direction of the nanostructure (once any ion beam is irradiated).

The nanostructure 20 may also be formed in a shape in which the thickness thereof is gradually changed. Particularly, in a case of a shape gradually tapering toward an end as shown in FIG. 3A, when the ion beam 10 having an appropriate level of energy is irradiated on the nanostructure 20, the nanostructure 20 is bent in the ion beam going direction P in the wide width portion W and is bent toward the direction of ion beam source S toward the narrow width portion N, thereby making a hook shape, as shown in FIG. 3B. As described above, when the method according to the present invention is applied, a complex shape such as the hook shape as shown in FIG. 3 may be easily and rapidly formed without changing the energy, the position, or the like of the ion beam 10 and without having any motion of the nanostructure 20.

When synthetically summarizing the description of FIGS. 2 and 3, it may be appreciated that when the ion beam is irradiated on the nanostructure, two variables, that is, [ion beam energy] and [thickness of the nanostructure] play a crucial role in the bending direction of the nanostructure. In the present invention, the nanostructure 20 is a one-dimensional or two-dimensional structure such as a nano tube, a nano wire, a cantilever, a thin film, or the like.

That is, according to the method of the present invention, the bending direction of the nanostructure may be freely adjusted without having any motion of the nanostructure by a method of irradiating energy of the ion beam on the nanostructure while appropriately changing ([ion beam energy] variable adjustment), irradiating one ion beam having an appropriate level of energy on the nanostructure having the variable thickness ([thickness of the nanostructure] variable adjustment), or irradiating energy of the ion beam which is appropriately changed on the nanostructure having the variable thickness ([ion beam energy] variable and [thickness of the nanostructure] variable adjustment). By appropriately irradiating the ion beam on the nanostructure having a basic shape such as the nano tube, the nano wire, the cantilever, the thin film, or the like, various shapes that the designer wishes may be easily manufactured without having any motion of the nanostructure.

Hereinafter, embodiments to which the method according to the present invention controlling the bending direction of the nanostructure by changing energy of the ion beam or the like as described above is variously applied will be described. Particularly, in FIGS. 4 to 8, an ion beam blocker 30 is further used, such that a more detailed change in the bending shape may be controlled.

Figure 4:
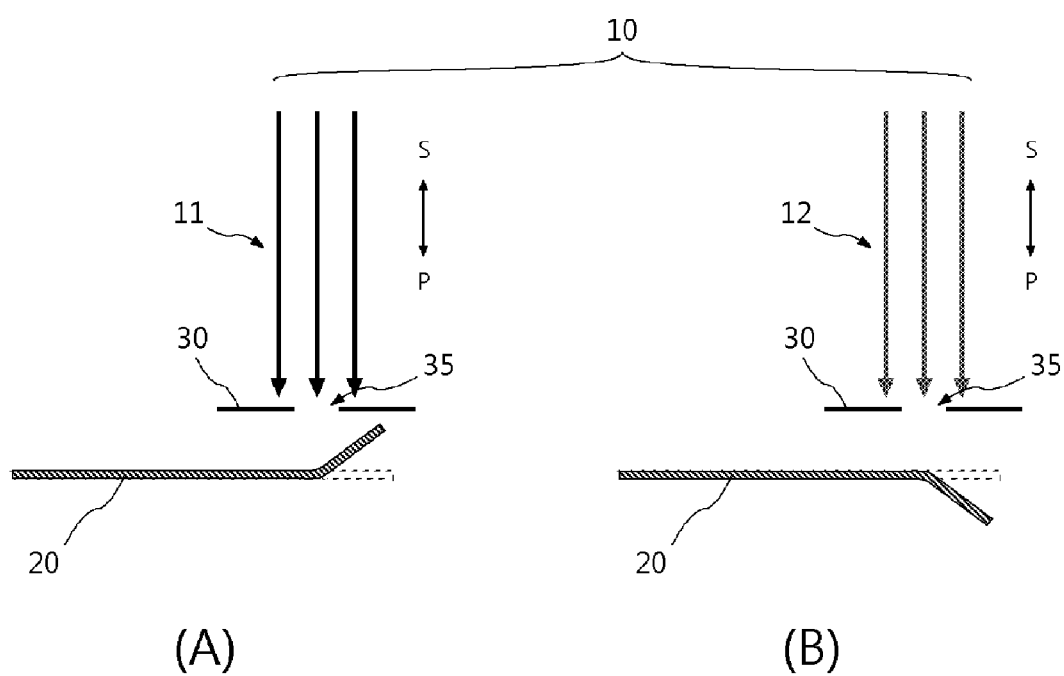
FIGS. 4 to 8 show embodiments of a bending shape change using an ion beam blocker.

As shown in FIG. 4, the ion beam blocker 30, which is provided between the ion beam 10 and the nanostructure 20, has a hole 35 formed therein and serves to block the progress of the ion beam 10 at portion other than the hole 35. Therefore, when using the ion beam blocker 30, the ion beam 10 may be irradiated on only a portion of the nanostructure 20 by the ion beam blocker 30. Of course, if the ion beam 10 irradiated through the hole 35 is the high energy ion beam 11, then the nanostructure 20 is bent toward the direction of ion beam source S as shown in FIG. 4A, and if the ion beam 10 irradiated through the hole 35 is the low energy ion beam 12, then the nanostructure 20 is bent in the ion beam going direction P as shown in FIG. 4B.

As described above, by allowing the ion beam 10 to be irradiated on only a portion of desired position of the nanostructure 20 using the ion beam blocker 30, the following advantages may be obtained. According to the related art, when the ion beam is irradiated up to the end portion of the nanostructure in order to allow the end portion of the nanostructure to face the ion beam source direction, the end portion of the nanostructure is damaged by the ion beam, such that it was a problem in the case in which a structure of the end portion of the nanostructure needs to be maintained. However, in the case of using the ion beam blocker 30 described above, the damage to the end portion is basically prevented by preventing the end portion of the nanostructure 20 from being irradiated by the ion beam 10, and the nanostructure 20 may be bent in a desired direction by the ion beam 10 irradiated through the hole 35.

Figure 5:
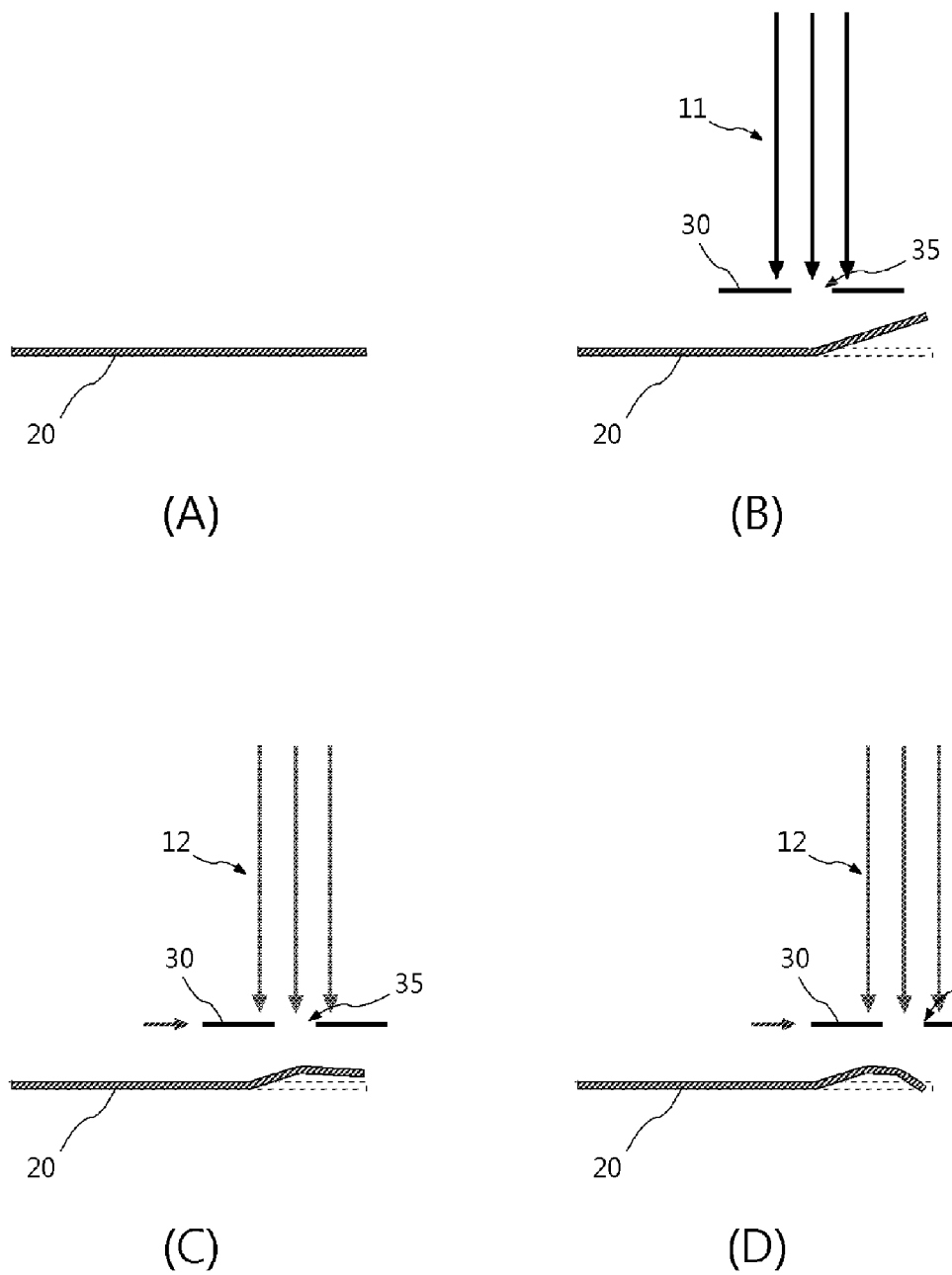
Figure 6:
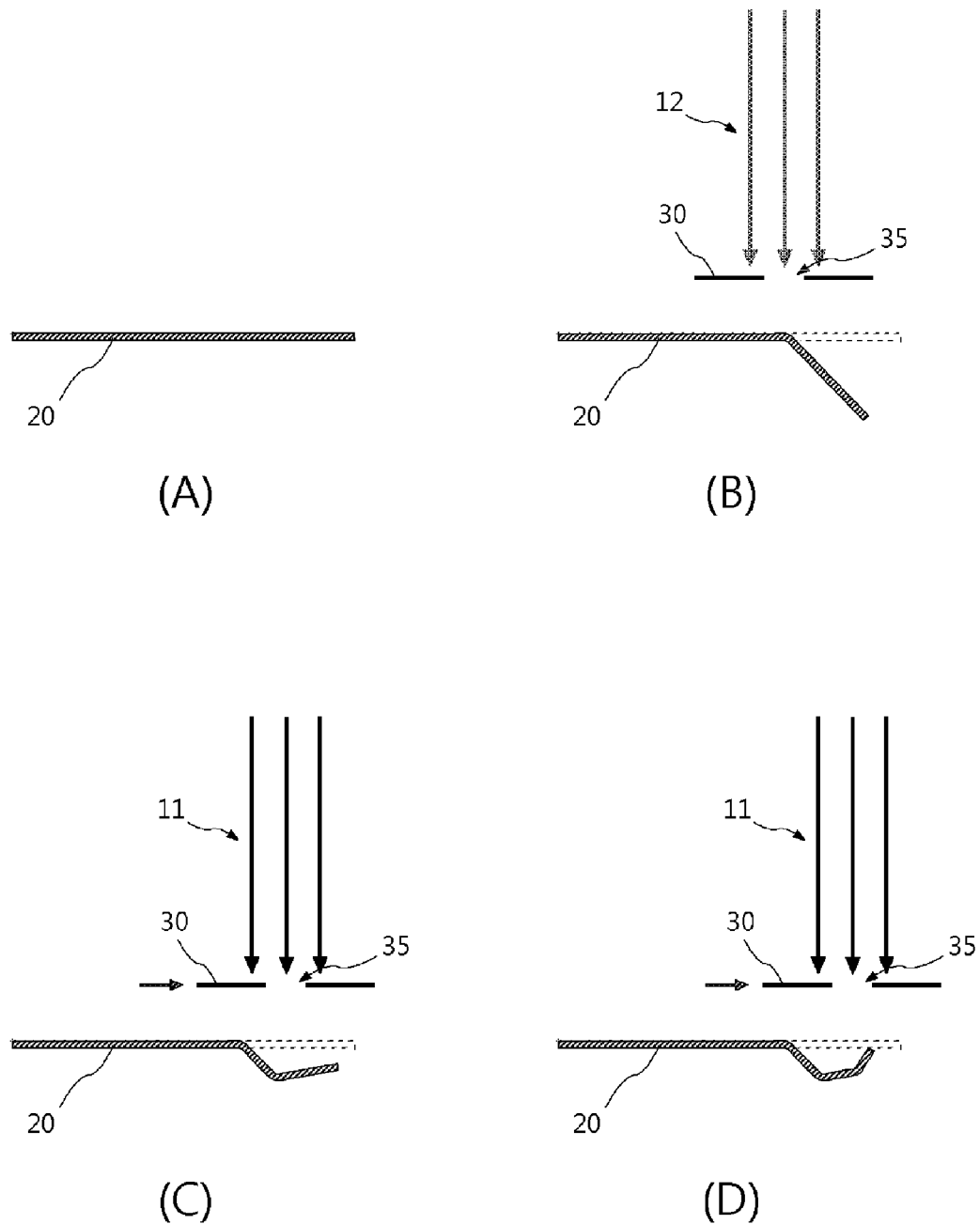

In addition, by allowing the position of the ion beam blocker 30 to be variable, the detailed change in the bending shape may be controlled. FIGS. 5 and 6 show embodiments each forming a shovel shape (FIG. 5) and a hook shape (FIG. 6) by changing energy of the ion beam 10 and varying the position of the ion beam blocker 30.

The embodiment of FIG. 5 will be described. First, for the nanostructure 20 having a bar shape as shown in FIG. 5A, the high energy ion beam 11 is irradiated on only a specific portion using the ion beam blocker 30 as shown in FIG. 5B. Then, the nanostructure 20 is bent toward the direction of ion beam source, that is, an upward direction based on FIG. 5 at the portion on which the high energy ion beam 11 is irradiated. Next, a position of the hole 35 is changed by moving the ion beam blocker 30 to an end direction of the nanostructure 20 as shown in FIG. 5C and the low energy ion beam 12 is then irradiated. Then, the nanostructure 20 is bent in the ion beam going direction, that is, a downward direction at the portion on which the low energy ion beam 12 is irradiated. Finally, after the position of the hole 35 is changed by further moving the ion beam blocker 30 to the end direction of the nanostructure 20 as shown in FIG. 5D, the low energy ion beam 12 is again irradiated. Then, the nanostructure 20 is further bent in the ion beam going direction, that is, the downward direction at the portion on which the low energy ion beam 12 is irradiated, thereby completing the shovel shape which is the desired shape.

The embodiment of FIG. 6 will be described. First, for the nanostructure 20 having a bar shape as shown in FIG. 6A, the low energy ion beam 12 is irradiated on only a specific portion using the ion beam blocker 30 as shown in FIG. 6B. Then, the nanostructure 20 is bent in the ion beam going direction, that is, a downward direction based on FIG. 6 at the portion on which the low energy ion beam 12 is irradiated. Next, a position of the hole 35 is changed by moving the ion beam blocker 30 to an end direction of the nanostructure 20 as shown in FIG. 6C and the high energy ion beam 11 is then irradiated. Then, the nanostructure 20 is bent toward the direction of ion beam source, that is, an upward direction at the portion on which the high energy ion beam 11 is irradiated. Finally, after the position of the hole 35 is changed by further moving the ion beam blocker 30 to the end direction of the nanostructure 20 as shown in FIG. 6D, the high energy ion beam 11 is again irradiated. Then, the nanostructure 20 is further bent toward the direction of ion beam source, that is, the upward direction at the portion on which the high energy ion beam 11 is irradiated, thereby completing the hook shape which is the desired shape.

Figure 7:
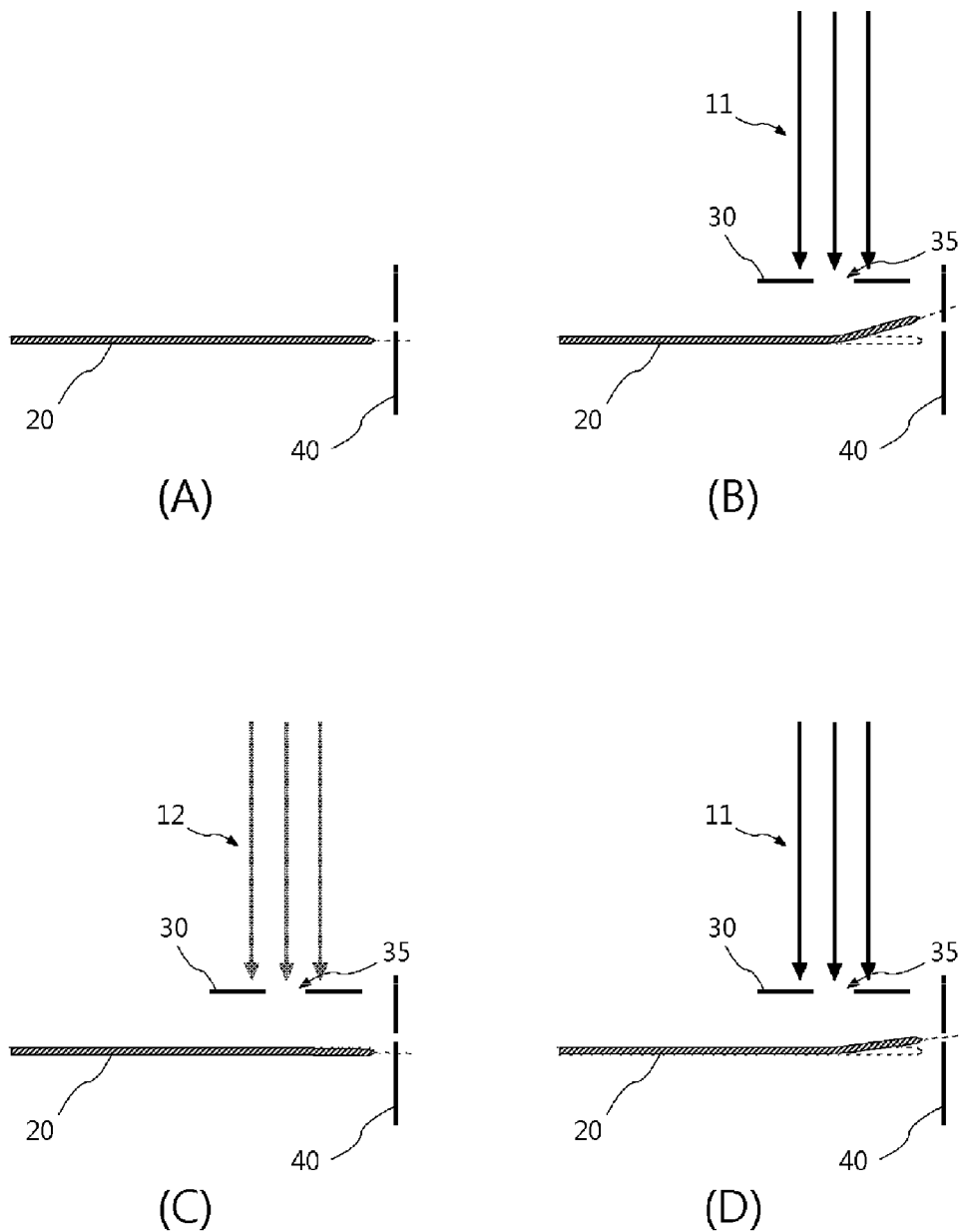

FIG. 7 shows processes of matching the end portion of the nanostructure 20 so as to face a desired position while not damaging the end portion of the nanostructure 20 using the ion beam blocker 30.

Assuming a case in which a target object 40 exists and it is attempted to accurately direct the end portion of the nanostructure 20 to the target object 40, particularly, a target position on the target object 40 (an opening in FIG. 7) as shown in FIG. 7. Particularly, the end portion of the nanostructure 20 has a sharp shape and it is a condition that this sharp shape is not damaged. In this case, assuming that the end portion of the nanostructure 20 is initially at a position lower than the target position of the target object 40 as shown in FIG. 7A.

Then, after the ion beam is firstly blocked using the ion beam blocker 30 so as not to be irradiated on the end portion of the nanostructure 20 as shown in FIG. 7B, the high energy ion beam 11 is firstly irradiated, thereby bending the nanostructure 20 toward the direction of ion beam source, that is, the upward direction. In this process, if the end portion of the nanostructure 20 directly faces the desired direction, the work is completed at this point, but if the nanostructure 20 is too bent, the end portion of the nanostructure 20 may face a position higher than the target position of the target object 40.

Then, as shown in FIG. 7C, by irradiating the low energy ion beam 12 in a state in which the ion beam blocker 30 is provided as it is, the nanostructure 20 is bent in the ion beam going direction, that is, the downward direction.

As such, by repeatedly performing the high energy ion beam 11 irradiation (bending the nanostructure 20 in the upward direction) and the low energy ion beam 12 irradiation (bending the nanostructure 20 in the downward direction) several times, finally, the end portion of the nanostructure 20 may accurately face the target position of the target object 40 as shown in FIG. 7D. In this process, since the ion beam is not irradiated at all on the end portion of the nanostructure 20 by the ion beam blocker 30, the sharp shape of the end portion of the nanostructure 20 is not damaged at all. Further, the bent direction of the nanostructure 20 may be freely changed by the repetitive and alternate irradiation of the high energy ion beam 11 and the low energy ion beam 12 as described above, such that there is no need to apply the motion rotating the nanostructure 20 in order to bend the nanostructure 20 in another direction, thereby maximizing workability. Further, since there is no need to change the irradiation position of the ion beam in this process, a mechanical motion is not generally required at all and the nanostructure 20 may be freely and precisely bent and transformed.

Figure 8:
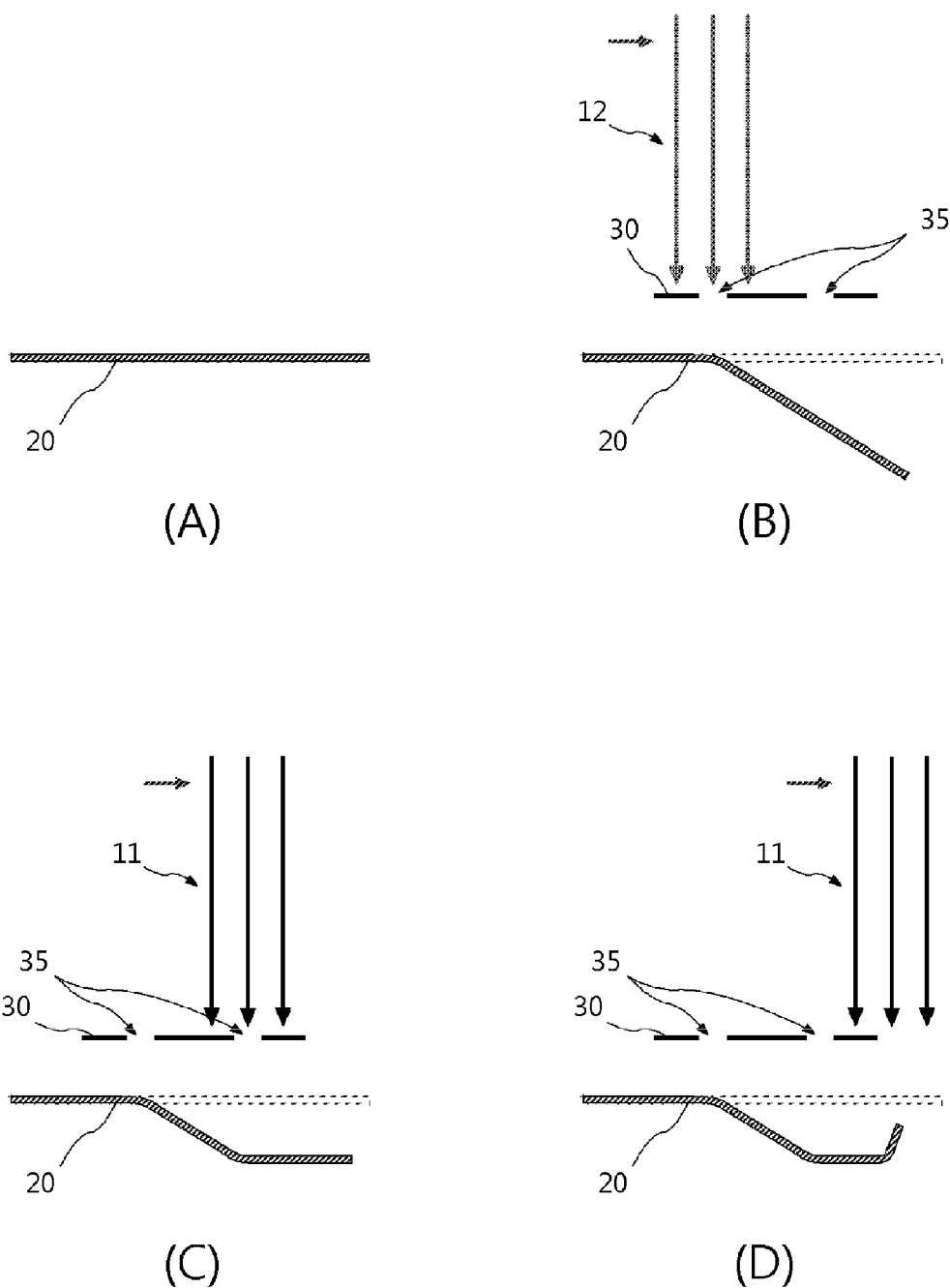

FIG. 8 shows an embodiment of another shape of the ion beam blocker 30. In the embodiment of FIG. 8, the ion beam blocker 30 is provided with a plurality of holes 35. Although the embodiments of FIGS. 4 to 7 show the examples in which a single hole 35 is formed in the ion beam blocker 30, the ion beam blocker 30 may be provided with at least one hole 35 as described above.

In the case in which the ion beam blocker 30 is provided with the plurality of holes 35 as shown in FIG. 8, the complex shape may be easily manufactured by varying the irradiation position of the ion beam 10 while not moving the ion beam blocker 30. First, for the nanostructure 20 having a bar shape as shown in FIG. 8A, the low energy ion beam 12 is irradiated through an inner hole 35 of the ion beam blocker 30 as shown in FIG. 8B. Then, the nanostructure 20 is bent in the ion beam going direction, that is, a downward direction at the portion on which the low energy ion beam 12 is irradiated. Next, the irradiation position of the ion beam is moved in the end direction of the nanostructure 20 as shown in FIG. 8C and the high energy ion beam 11 is irradiated through an outer hole 35. Then, the nanostructure 20 is bent toward the direction of ion beam source, that is, an upward direction at the portion on which the high energy ion beam 11 is irradiated. Finally, the irradiation position of the ion beam is further moved in the end direction of the nanostructure 20 as shown in FIG. 8D and the high energy ion beam 11 is again irradiated. Then, the nanostructure 20 is further bent toward the direction of ion beam source, that is, the upward direction at the portion on which the high energy ion beam 11 is irradiated, thereby completing the hook shape.

Although FIG. 6 described above shows the process of forming the hook shape, this process uses the ion beam blocker having the single hole 35 formed therein, such that the process of moving the ion beam blocker 30 was required. In the case of FIG. 8, however, the plurality of holes 35 are formed in the ion beam blocker 30 and only the irradiation position needs to be changed to the desired position of the hole 35, such that a precise control, or the like necessary to change the position of the ion beam blocker 30 is not required, thereby making the work process easier. The change of the irradiation position and the energy adjustment of the ion beam may be easily implemented by inputting an appropriate position changing program to an ion beam irradiation apparatus. Particularly, when using this method, the ion beam blocker 30 having the plurality of holes 35 formed therein acts as a mold, such that the nanostructure 20 having the same shape may be rapidly mass-manufactured.

According to the present invention as described above, the ion beam blocker 30 or the irradiation position of the ion beam 10 is appropriately varied, thereby making it possible to accurately, easily, and rapidly mass-manufacture the desired shape.

FIG. 9 shows an embodiment of a bending shape change on a three-dimensional space using a pair of ion beams orthogonal to each other. Assuming the nanostructure 20 having a bar shape extended to a y axis as shown in FIG. 9A, if a pair of ion beams 10 (the high energy ion beam 11 or the low energy ion beam 12) in an x axis direction and a z axis direction are appropriately irradiated on the nanostructure 20, then the nanostructure 20 is bent on a three-dimensional space depending on energy of the ion beams 10.

As described above, when the nanostructure 20 is the one-dimensional shape, the pair of ion beams 10 perpendicular to an extended direction (the y axis in the embodiment of FIG. 9) of the nanostructure 20 and formed so as to be orthogonal to each other (the x axis and the z axis in the embodiment of FIG. 9) are each irradiated on the nanostructure 20, such that the nanostructure 20 may face the desired direction on the three-dimensional space. Of course, although FIG. 9 shows the embodiment in which the pair of ion beams 10 is configured of the high energy ion beam 11 and the low energy ion beam 12, the pair of ion beams 10 may be configured of only the high energy ion beam 11, may be configured of only the low energy ion beam 12, and the like. Therefore, the configuration of the pair of ion beams 10 may be variously changed.

The present invention is not limited to the above-mentioned embodiments but may be variously applied, and may be variously modified by those skilled in the art to which the present invention pertains without departing from the gist of the present invention claimed in the claims.

INDUSTRIAL APPLICABILITY

According to the present invention, since a precise control work such as a readjustment of an irradiation position of the ion beam during a motion of the nanostructure or after the motion of the nanostructure may be essentially omitted, resources such as time, workers, cost, and the like necessary to perform the above-mentioned work may be significantly saved. In addition, the formation may be made without worrying about the damage to a specific portion such as the end portion of the nanostructure. Further, since the time taken in the formation work such as bending is significantly saved as described above, the nanostructure having a desired form may be very rapidly mass-produced.

The invention claimed is:

1. A movement-free bending method for a one-dimensional or two-dimensional nanostructure (20) using an ion beam (10), wherein
 a bending direction of the nanostructure (20) is controlled depending on energy of the ion beam (10).

2. The method of claim 1, wherein the bending direction and a shape of the nanostructure (20) are adjusted by repeatedly and alternately irradiating high energy ion beam (11) having energy bending the nanostructure (20) toward the direction of ion beam source (S) and low energy ion beam (12) having energy bending the nanostructure (20) to ion beam going direction (P).

3. A movement-free bending method for a one-dimensional or two-dimensional nanostructure (20) using an ion beam (10), wherein
 a bending direction of the nanostructure (20) is controlled depending on a thickness of the nanostructure (20).

4. The method of claim 3, wherein the nanostructure (20) is formed in a shape comprising a narrow width portion (N) having a thickness bent toward the direction of ion beam source (S) and a wide width portion (W) having a thickness bent to ion beam going direction at the time of irradiating the ion beam (10), such that the ion beam (10) is irradiated on the nanostructure (20) comprising the narrow width portion (N) and the wide width portion (W) to thereby form a shape in which the bending direction is changed for an extended direction of the nanostructure (20).

5. The method of claim 3, wherein the nanostructure (20) is formed in a shape in which the thickness thereof is gradually changed.

6. The method of claim 1, wherein the nanostructure (20) is at least one selected from a nano tube, a nano wire, a cantilever, and a thin film.

7. The method of claim 1, wherein a hole (35) is formed between the ion beam (10) and the nanostructure (20), and an ion beam blocker (30) blocking a progress of the ion beam (10) at portions other than the hole (35) is provided, such that the ion beam (10) is irradiated on only a portion of the nanostructure (20) by the ion beam blocker (30).

8. The method of claim 7, wherein the ion beam blocker (30) has at least one hole (35) formed therein.

9. The method of claim 8, wherein the ion beam blocker (30) has a variable position.

10. The method of claim 1, wherein the ion beam (10) has a variable irradiation position.

11. The method of claim 1, wherein the nanostructure (20) has a one-dimensional shape and a pair of ion beams (10) are irradiated on the nanostructure (20); and
 the pair of ion beams (10) are formed so as to be each perpendicular to an extended direction of the nanostructure (20) and be orthogonal to each other.

12. The method of claim 3, wherein the nanostructure (20) is at least one selected from a nano tube, a nano wire, a cantilever, and a thin film.

13. The method of claim 3, wherein a hole (35) is formed between the ion beam (10) and the nanostructure (20), and an ion beam blocker (30) blocking a progress of the ion beam (10) at portions other than the hole is provided, such that the ion beam (10) is irradiated on only a portion of the nanostructure (20) by the ion beam blocker (30).

14. The method of claim 13, wherein the ion beam blocker (30) has at least one hole (35) formed therein.

15. The method of claim 14, wherein the ion beam blocker (30) has a variable position.

16. The method of claim 3, wherein the ion beam (10) has a variable irradiation position.

17. The method of claim 3, wherein the nanostructure (20) has a one-dimensional shape and a pair of ion beams (10) are irradiated on the nanostructure (20); and
 the pair of ion beams (10) are formed so as to be each perpendicular to an extended direction of the nanostructure (20) and be orthogonal to each other.

\* \* \* \* \*